(12) United States Patent
Ramsbey et al.

(10) Patent No.: US 8,673,716 B2
(45) Date of Patent: Mar. 18, 2014

(54) MEMORY MANUFACTURING PROCESS WITH BITLINE ISOLATION

(75) Inventors: Mark T. Ramsbey, Sunnyvale, CA (US); Tazrien Kamal, San Jose, CA (US); Jean Y. Yang, Sunnyvale, CA (US); Emmanuil Lingunis, San Jose, CA (US); Hidehiko Shiraiwa, San Jose, CA (US); Yu Sun, Saratoga, CA (US)

(73) Assignee: Spansion LLC, Sunnyvale, CA (US)

( * ) Notice: Subject to any disclaimer, the term of this patent is extended or adjusted under 35 U.S.C. 154(b) by 1267 days.

(21) Appl. No.: 10/118,732

(22) Filed: Apr. 8, 2002

(65) Prior Publication Data
US 2003/0190786 A1    Oct. 9, 2003

(51) Int. Cl.
    *H01L 21/8247*    (2006.01)
(52) U.S. Cl.
    USPC .................................. 438/258; 257/E21.179
(58) Field of Classification Search
    USPC .................... 438/257–267, 954; 257/E21.179
    See application file for complete search history.

(56) References Cited

U.S. PATENT DOCUMENTS

| | | | |
|---|---|---|---|
| 4,342,149 A | 8/1982 | Jacobs et al. | |
| 4,516,313 A | 5/1985 | Turi et al. | |
| 5,815,433 A | 9/1998 | Takeuchi | |
| 6,436,759 B1 * | 8/2002 | Chien et al. | 438/241 |
| 6,468,838 B2 * | 10/2002 | Chien et al. | 438/142 |
| 6,566,194 B1 * | 5/2003 | Ramsbey et al. | 438/257 |
| 6,797,565 B1 * | 9/2004 | Yang et al. | 438/261 |

FOREIGN PATENT DOCUMENTS

| | | |
|---|---|---|
| CN | 1647265 A | 7/2005 |
| DE | 60329993.8 | 11/2009 |
| EP | 0163 871 A1 | 12/1985 |
| EP | 1493185 B1 | 11/2009 |
| JP | 2005-522880 A | 7/2005 |
| KR | 10-2005-0003357 A | 1/2005 |
| TW | I271822 B | 1/2007 |
| WO | WO-03/088353 A1 | 10/2003 |

OTHER PUBLICATIONS

International Search Report for Application No. PCT/US03/04461, mailed Sep. 5, 2003.

* cited by examiner

*Primary Examiner* — Richard Booth

(57) ABSTRACT

A method of manufacturing an integrated circuit is provided with a semiconductor substrate having a core region and a periphery region. A charge-trapping dielectric layer is deposited in the core region, and a gate dielectric layer is deposited in the periphery region. Bitlines are formed in the semiconductor substrate in the core region and not in the periphery region. A wordline-gate layer is formed and implanted with dopant in the core region and not in the periphery region. A wordline and gate are formed. Source/drain junctions are implanted with dopant in the semiconductor substrate around the gate, and the gate is implanted with a gate doping implantation in the periphery region and not in the core region.

14 Claims, 5 Drawing Sheets

MEMORY MANUFACTURING PROCESS WITH BITLINE ISOLATION

BACKGROUND OF THE INVENTION

1. Technical Field

The present invention relates generally to semiconductor technology and more specifically to reducing the number of steps in forming MirrorBit® Flash memory.

2. Background Art

Different types of memories have been developed in the past as electronic memory media for computers and similar systems. Such memories include electrically erasable programmable read only memory (EEPROM) and electrically programmable read only memory (EPROM). Each type of memory had advantages and disadvantages. EEPROM can be easily erased without extra exterior equipment but with reduced data storage density, lower speed, and higher cost. EPROM, in contrast, is less expensive and has greater density but lacks erasability.

A newer type of memory called "Flash" EEPROM, or Flash memory, has become extremely popular because it combines the advantages of the high density and low cost of EPROM with the electrical erasability of EEPROM. Flash memory can be rewritten and can hold its contents without power. It is used in many portable electronic products, such as cell phone, portable computers, voice recorders, etc. as well as in many larger electronic systems, such as cars, planes, industrial control systems, etc.

In Flash memory, bits of information are programmed individually as in the older types of memory, such as dynamic random access memory (DRAM) and static random access memory (SRAM) memory chips. However, in DRAMs and SRAMs where individual bits can be erased one at a time, Flash memory must currently be erased in fixed multi-bit blocks or sectors.

Conventionally, Flash memory is constructed of many Flash memory cells where a single bit is stored in each memory cell and the cells are programmed by hot electron injection and erased by Fowler-Nordheim tunneling. However, increased market demand has driven the development of Flash memory cells to increase both the speed and the density. Newer Flash memory cells have been developed that allow more than a single bit to be stored in each cell.

One memory cell structure involves the storage of more than one level of charge to be stored in a memory cell with each level representative of a bit. This structure is referred to as a multi-level storage (MLS) architecture. Unfortunately, this structure inherently requires a great deal of precision in both programming and reading the differences in the levels to be able to distinguish the bits. If a memory cell using the MLS architecture is overcharged, even by a small amount, the only way to correct the bit error would be to erase the memory cell and totally reprogram the memory cell. The need in the MLS architecture to precisely control the amount of charge in a memory cell while programming also makes the technology slower and the data less reliable. It also takes longer to access or "read" precise amounts of charge. Thus, both speed and reliability are sacrificed in order to improve memory cell density.

An even newer technology allowing multiple bits to be stored in a single cell is known as "MirrorBit®" Flash memory has been developed. In this technology, a memory cell is essentially split into two identical (mirrored) parts, each of which is formulated for storing one of two independent bits. Each MirrorBit Flash memory cell, like a traditional Flash cell, has a gate with a source and a drain. However, unlike a traditional Flash cell in which the source is always connected to an electrical source and the drain is always connected to an electrical drain, each MirrorBit Flash memory cell can have the connections of the source and drain reversed during operation to permit the storing of two bits.

The MirrorBit Flash memory cell has a semiconductor substrate with dopant implanted conductive bitlines. A multilayer storage layer, referred to as a "charge-trapping dielectric layer", is formed over the semiconductor substrate. The charge-trapping dielectric layer can generally be composed of three separate layers: a first insulating layer, a charge-trapping layer, and a second insulating layer. Wordlines are formed over the charge-trapping dielectric layer perpendicular to the bitlines. Programming circuitry controls two bits per cell by applying a signal to the wordline, which acts as a control gate, and changing bitline connections such that one bit is stored by source and drain being connected in one arrangement and a complementary bit is stored by the source and drain being interchanged in another arrangement.

Programming of the cell is accomplished in one direction and reading is accomplished in a direction opposite that in which it is programmed.

A major problem in the past has been that the core and the periphery were implanted with dopant at the same time and, as devices became smaller, it was found that this implant would cause short-circuiting of the buried bitlines because of the difficulty in controlling implant density with smaller devices.

A solution to this problem has been long sought but has long eluded those skilled in the art.

DISCLOSURE OF THE INVENTION

The present invention provides a method of manufacturing an integrated circuit with a semiconductor substrate having a core region and a periphery region. A charge-trapping dielectric layer is deposited in the core region, and a gate dielectric layer is deposited in the periphery region. Bitlines are formed in the semiconductor substrate in the core region and not in the periphery region. A wordline-gate layer is formed and implanted with dopant in the core region and not in the periphery region. A wordline and a gate are then formed. Source/drain junctions and the gate are implanted with dopant in the periphery region and not in the core region. This method eliminates the problem of the short-circuiting of the buried bitlines because of the difficulty in controlling implant density with smaller devices.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
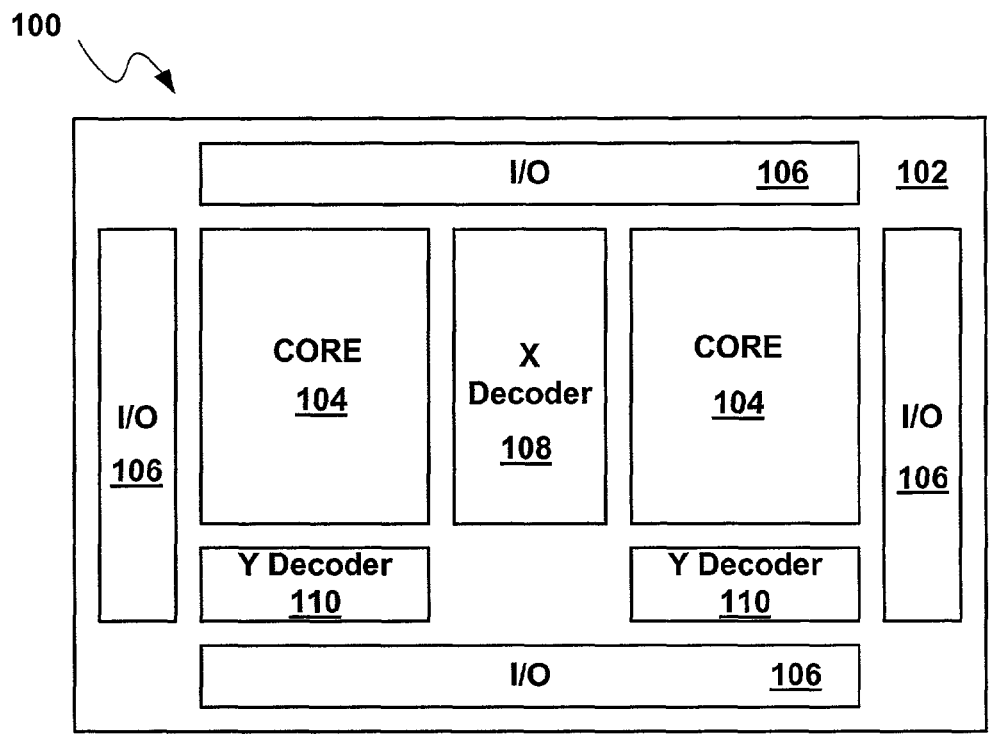
FIG. 1 is a plan view of a MirrorBit Flash EEPROM according to the present invention.

Referring now to FIG. 1, therein is shown a plan view of a MirrorBit® Flash EEPROM 100, which commonly includes a semiconductor substrate 102 in which one or more high-density core regions and one or more low-density peripheral portions are formed. The EEPROM 100 is manufactured according to the process of the present invention. High-density core regions typically include one or more M×N array cores 104 of individually addressable, substantially identical MirrorBit Flash memory cells. Low-density peripheral portions typically include input/output (I/O) circuitry and programming circuitry for selectively addressing the individual memory cells. The programming circuitry is represented in part by and includes one or more x-decoders 108 and y-decoders 110, cooperating with I/O circuitry 106 for connecting the source, gate, and drain of selected addressed memory cells to predetermined voltages or impedances to effect designated operations on the memory cell, e.g., programming, reading, and erasing, and deriving necessary voltages to effect such operations.

The term "horizontal" as used in herein is defined as a plane parallel to the conventional plane or surface the semiconductor substrate 102 regardless of its orientation. The term "vertical" refers to a direction perpendicular to the horizontal as just defined. Terms, such as "on", "above", "below", "higher", "lower", "over", "under", "thick", "side" and "beside", are defined with respect to these horizontal and vertical planes. The terms such as "processed" and "formed" as used herein is defined to include one or more of the following: depositing or growing semiconductor materials, masking, patterning, photolithography, etching, implanting, removal, and/or stripping.

Figure 2:
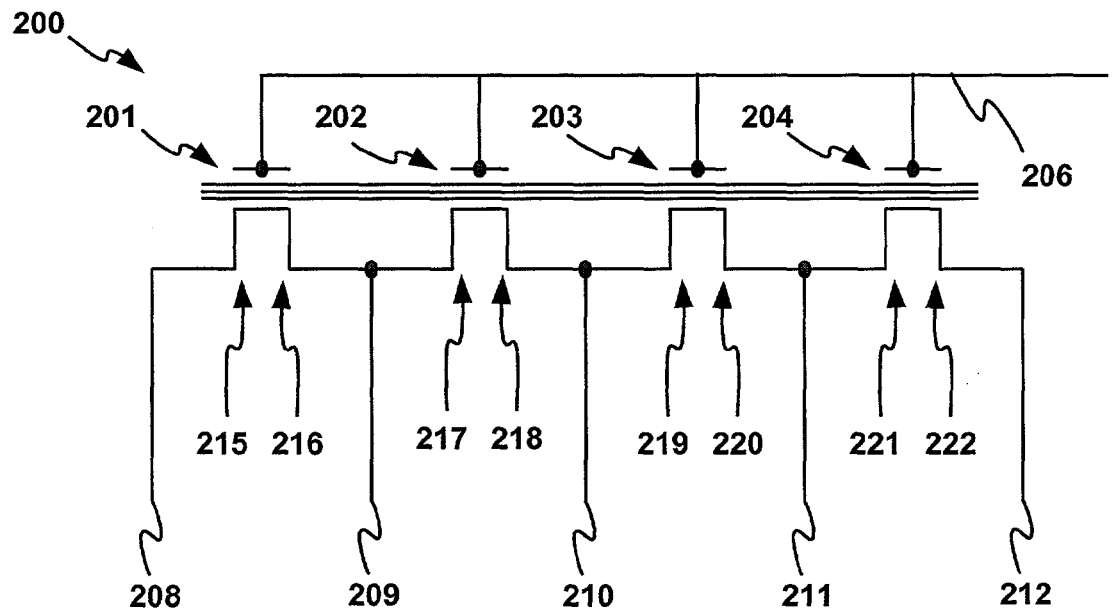
FIG. 2 is a circuit schematic of a portion of one of the M×N array cores of FIG. 1.

Referring now to FIG. 2, therein is shown a circuit schematic of a portion of one of the M×N array cores 104 of FIG. 1. The circuit schematic shows a line of memory cells 200, which includes memory cells 201 through 204 and which together can form an 8-bit word. Each of the memory cells 201 through 204 is connected to a wordline 206, which acts as a control gate. Each of the memory cells 201 through 204 has two associated bitlines with most of the memory cells having a common bitline. The memory cell 201 has associated bitlines 208 and 209; the memory cell 202 has associated bitlines 209 and 210; the memory cell 203 has associated bitlines 210 and 211; and the memory cell 204 has associated bitlines 211 and 212.

Depending upon a signal on the wordline and the connection of the bitlines in a memory cell to an electrical source or drain, the memory cells 201 through 204 are capable of writing, reading, and erasing bits at locations 215 through 222. For example, control of the bit at location 215 is achieved through connection of the drain to the bitline 208 and the source to the bitline 209. Similarly, control of the bit at location 216 is achieved through connection of the drain to the bitline 209 and the source to the bitline 208. Although adjacent memory cells share common bitlines, the adjacent memory cells do not interfere with each other because the memory cells are programmed one at a time and only one memory cell is active at a time while programming.

Figure 3:
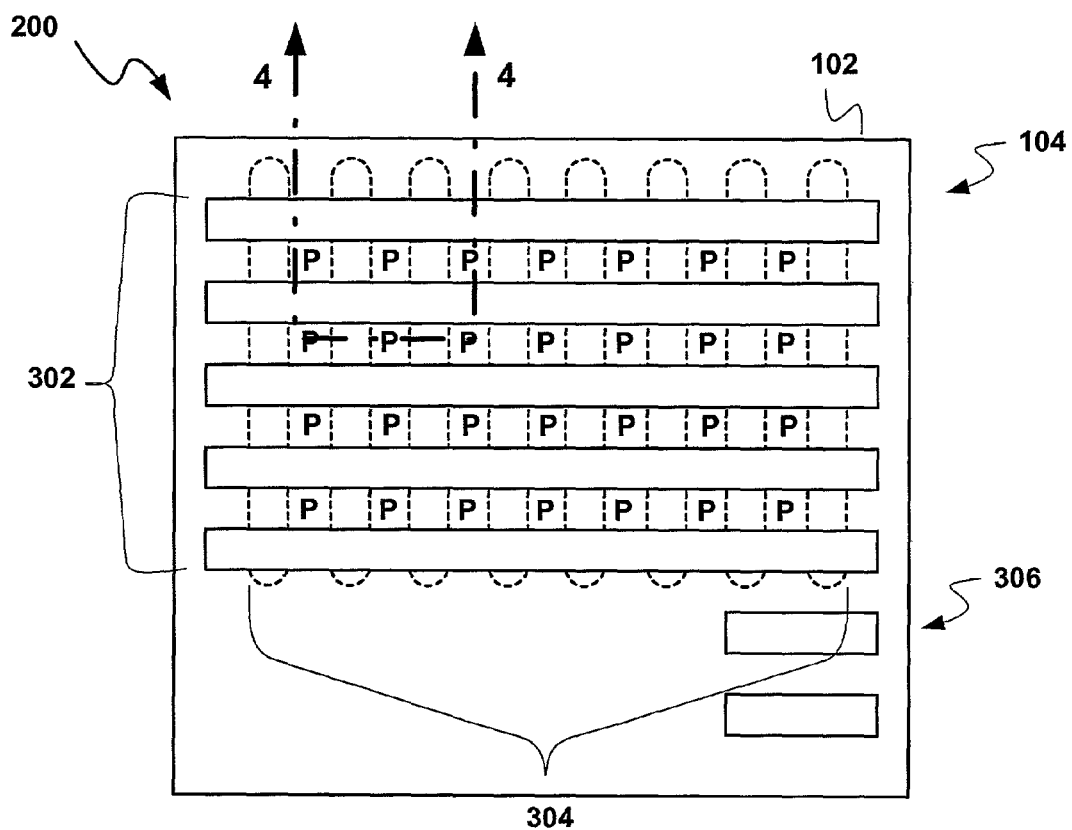
FIG. 3 is a plan view of a portion of one of the M×N array cores and periphery gates of FIG. 1.

Referring now to FIG. 3, therein is shown a plan view of a portion of one of the M×N array cores 104 of FIG. 1. The semiconductor substrate 102 has a plurality of dopant implanted bitlines 304 extending in parallel with a plurality of formed wordlines 302 extending in parallel and at right angles to the plurality of dopant implanted bitlines 304. The wordlines 302 and bitlines 304 have contacts and interconnections (not shown) to transistors 306 of the programming circuitry represented in part by x-decoders 108 and y-decoders 110 of FIG. 1.

Figure 4:
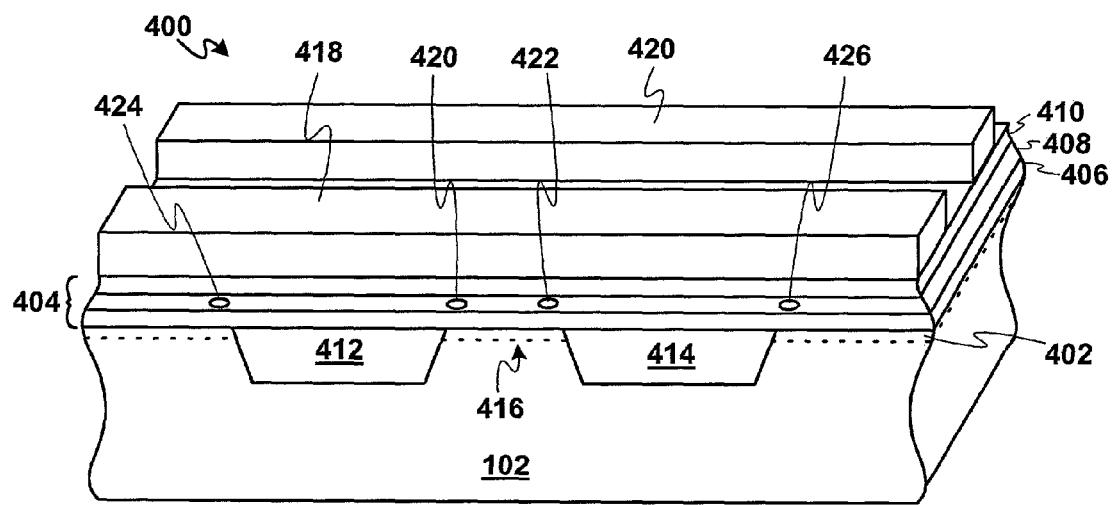
FIG. 4 is a cross-sectional isometric view of a memory cell along the line 4-4 of FIG. 3.

Referring now to FIG. 4, therein is shown a cross-sectional isometric view of a typical MirrorBit Flash memory cell along the line 4-4 of FIG. 3, such as a memory cell 400. The semiconductor substrate 102 is a p-doped silicon substrate with a threshold adjustment implant 402 of a p-type material, such as boron. The threshold adjustment implant 402 provides a region that is more heavily doped than the semiconductor substrate 102 itself and assists in the control of the threshold voltage of the memory cell 400.

A charge-trapping dielectric layer 404 is deposited over the semiconductor substrate 102. The charge-trapping dielectric layer 404 generally can be composed of three separate layers: a first insulating layer 406, a charge-trapping layer 408, and a second insulating layer 410. The first and second insulating layers 406 and 410 are of an oxide dielectric such as silicon dioxide ($SiO_2$) and the charge-trapping layer 408 is of a nitride dielectric such as silicon nitride ($Si_xN_y$). The oxide-nitride-oxide configuration is frequently referred to as a matter of convenience as an "ONO layer".

The bitlines 304 of FIG. 3 are implanted with dopant under the charge-trapping dielectric layer 404 in the semiconductor substrate 102 as typified by first and second conductive bitlines 412 and 414. They are typically of an implanted n-type material, such as arsenic, and can include an oxide portion (not shown) in some embodiments. The first and second conductive bitlines 412 and 414 are spaced apart and define a volume between them with the threshold adjustment implant 402, which is a channel 416.

A material, such as polysilicon, is deposited over the charge-trapping dielectric layer 404, patterned, etched, and stripped resulting in a wordline 418. The wordline 418 is one of the wordlines 302 in FIG. 3.

It is understood that the implementation of each step in manufacturing has associated processing steps.

The locations 420 through 422 indicate where bits can be stored in the memory cell 400 and locations 424 and 426 are adjacent locations, which are independent of the memory cell 400.

Figure 5:
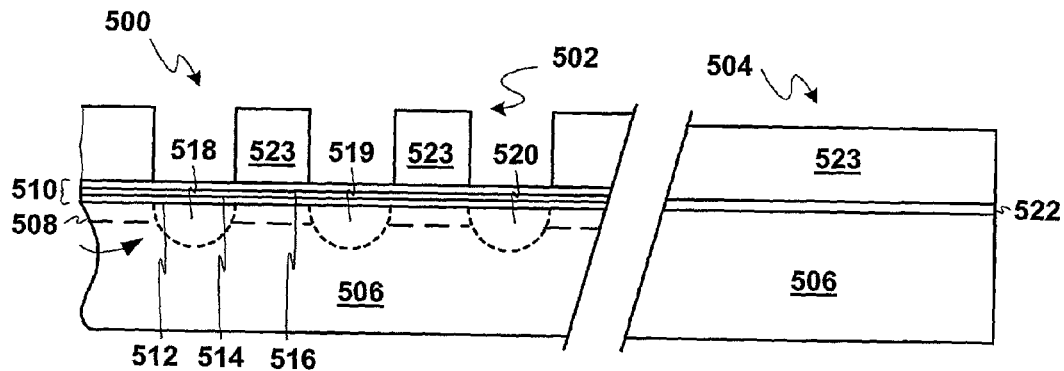
FIG. 5 is a cross-sectional view of a partially processed EEPROM in accordance with the present invention.

Referring now to FIG. 5, therein is shown a cross-sectional view of a partially processed EEPROM 500, which has a silicon substrate 506, a core region 502, which will be densely covered with MirrorBit Flash cells when processing is complete, and a periphery region 504, which will be less dense and will have other control devices thereon.

In the core region 502, where memory cells are to be formed, a p-type silicon substrate 506 has been implanted or processed with a p-type threshold adjustment implant 508. A charge-trapping dielectric layer 510 is deposited over the silicon substrate 506. The charge-trapping dielectric layer 510 generally can be composed of three separate layers: a first insulating layer 512, a charge-trapping layer 514, and a second insulating layer 516. The first and second insulating layers 512 and 516 may be of an oxide dielectric such as silicon dioxide ($SiO_2$) and the charge-trapping layer 514 may be of a nitride dielectric such as silicon nitride (SiN) to form an ONO layer. It will be noted that the present invention is not limited to specific dielectric or charge-trapping materials. The bitlines 518 through 520, which may be n-type bitlines, are implanted with dopant under the charge-trapping dielectric layer 510 in the silicon substrate 506.

In the periphery region 504, where transistors 306 will be formed, the p-type silicon substrate 506 has been implanted or processed with the p-type threshold adjustment implant 508. A gate dielectric layer 522 is deposited on the silicon substrate 506. The gate dielectric layer 522 generally is a gate oxide, or silicon dioxide. Deposited over the gate dielectric layer 522 is a bitline photoresist layer 523, which assures that bitlines are not implanted into the periphery region 504.

Figure 6:
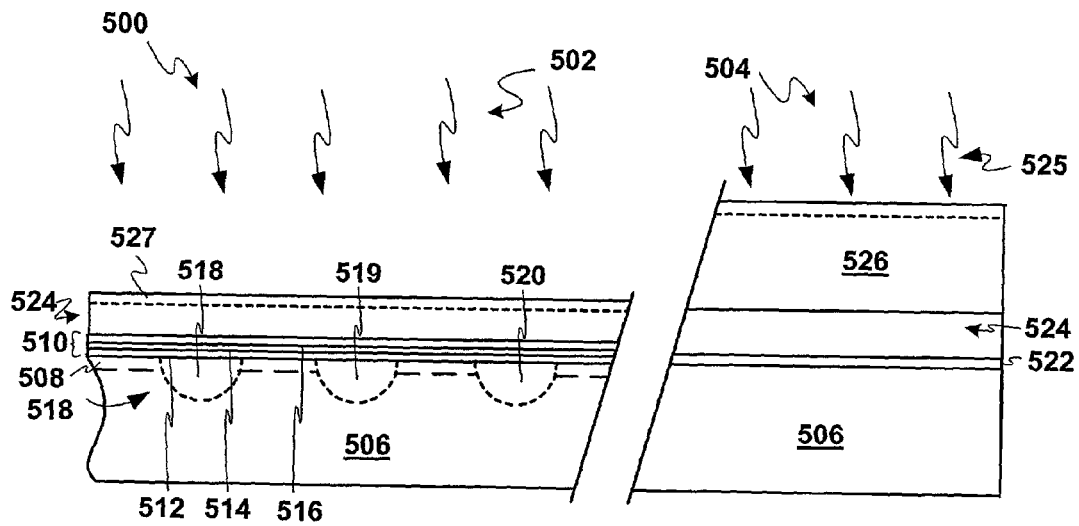
FIG. 6 is the structure of FIG. 5 after deposition of a wordline-gate layer and during a dopant implantation process.

Referring now to FIG. 6, therein is shown the structure of FIG. 5 after deposition of a wordline-gate layer 524 and during a dopant implantation process 525. Prior to the dopant implantation process 525, a periphery photoresist layer 526 is deposited and patterned so as to cover the periphery region 504.

The wordline-gate layer 524 is generally amorphous polysilicon and the periphery photoresist layer 526 is generally of an organic photoresist material. Where the transistors and memory cell are of a NPN-type structure, the dopant implantation process 525 will generally be of an n-type dopant. However, the present invention may be used with PNP-type structures in which case the dopant implantation process 525 will use a p-type dopant. The dopant implantation process 525 forms a doped region 527 in the top of the wordline-gate layer 524.

Figure 7:
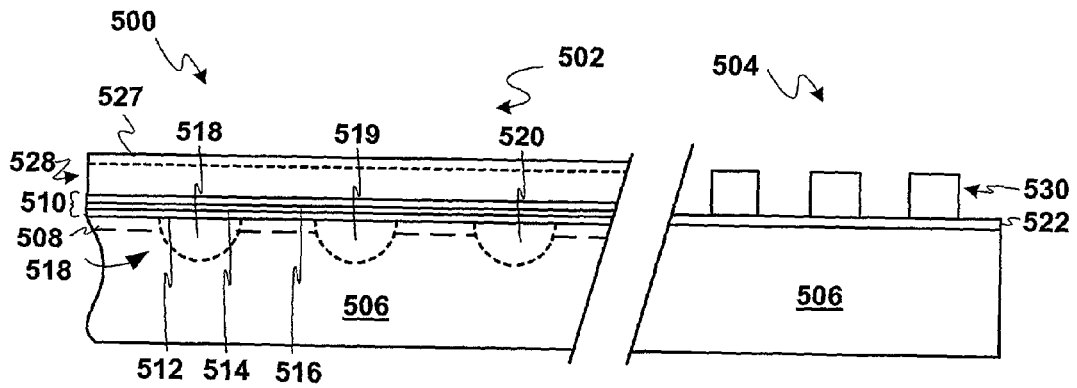
FIG. 7 is the structure of FIG. 6 after formation of the wordlines and the gates.

Referring now to FIG. 7, therein is shown the structure of FIG. 6 after formation of wordlines 528 and gates 530. The periphery photoresist layer 526 is removed and the wordline-gate layer 524 is processed to form the wordlines 528 and the gates 530. Although not shown in FIG. 7, the wordlines 528 generally have rectangular cross-sections and will have doped regions 527 on the top. It will be noted that at this point, the gates 530 will not be implanted with dopant because the periphery photoresist layer 526 would have covered them during the dopant implantation process 525.

Figure 8:
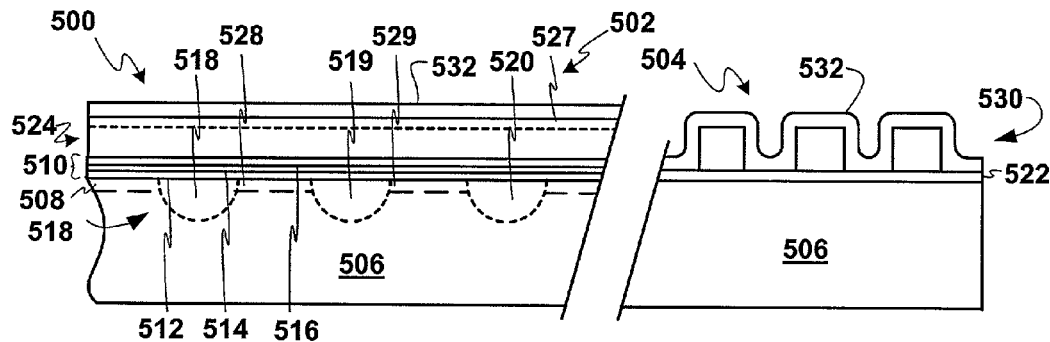
FIG. 8 is the structure of FIG. 7 after deposition of a conformal spacer layer.

Referring now to FIG. 8, therein is shown the structure of FIG. 7 after deposition of a conformal spacer layer 532. The conformal spacer layer 532 may be of materials such as silicon oxide, silicon nitride, or silicon oxynitride. Optionally, lightly doped source/drain junctions or extensions are also formed.

Figure 9:
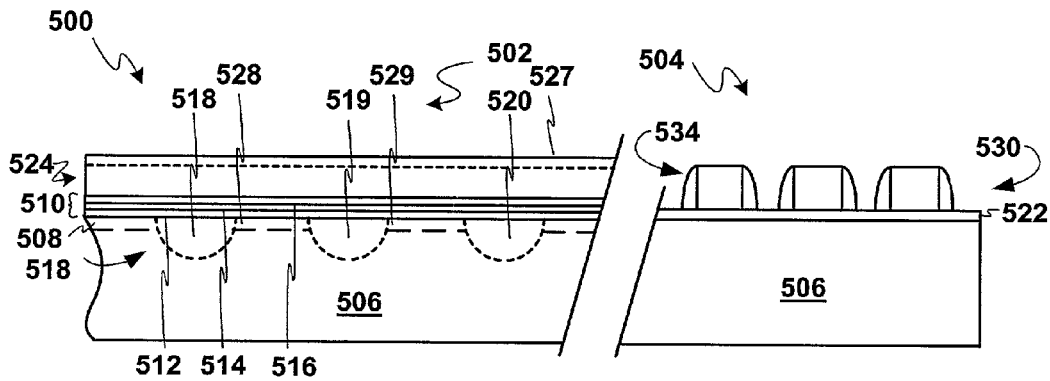
FIG. 9 is the structure of FIG. 8 after etching of the conformal stop layer.

Referring now to FIG. 9, therein is shown the structure of FIG. 8 after etching of a conformal stop layer 532 to form spacers 534 around the gates 530 and the wordlines 524.

Figure 10:
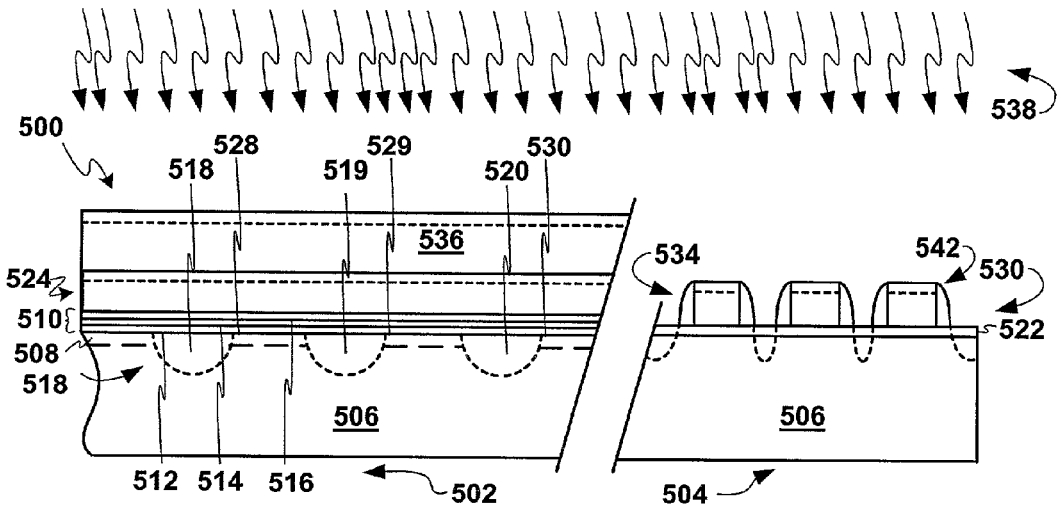
FIG. 10 is the structure of FIG. 9 during a heavy dopant implantation process.

Referring now to FIG. 10, therein is shown the structure of FIG. 9 during a heavy dopant implantation process 538. A core photoresist layer 536 has been deposited over the core to protect the bitline isolation areas, which are designated by the p in FIG. 3, from a heavy dopant implantation process 538, which implants the source/drain junctions 540 and the gate doping implants 542 in the periphery region 504. Again, the dopant for the heavy dopant implantation process 538 will be dependant upon the NPN or PNP structure of the devices.

With the removal of the core photoresist layer 536, this portion of the EEPROM 100 is ready to be further processed into a completed integrated circuit.

Figure 11:
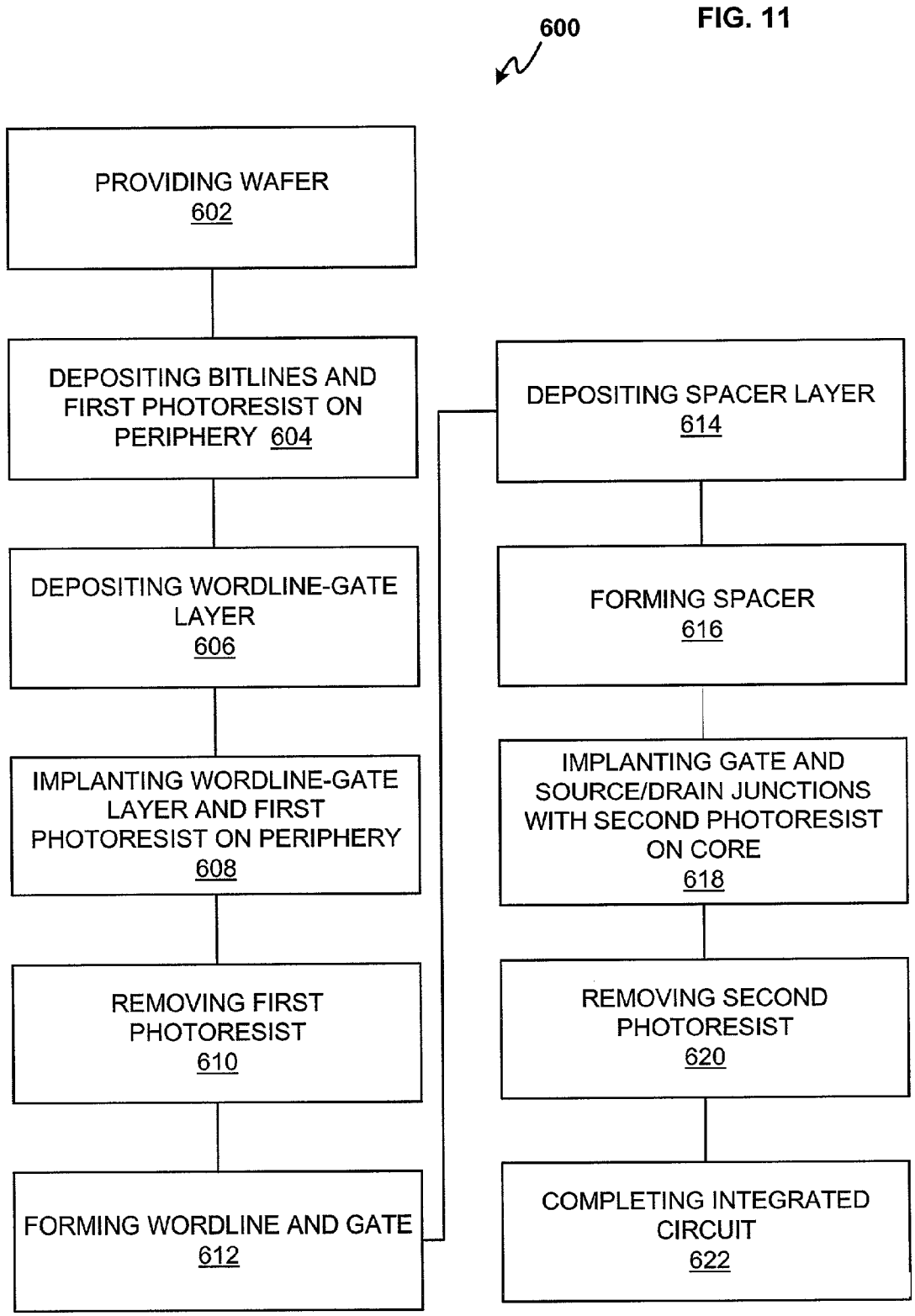
FIG. 11 is a simplified flow chart in accordance with the present invention.

Referring now to FIG. 11, therein is shown a simplified process chart 600 of the present invention which includes: providing wafer 602; depositing bitlines and first photoresist on periphery 604; depositing wordline-gate layer and first photoresist on periphery 606; implanting wordline-gate layer and first photoresist 608; removing first photoresist 610; forming wordline and gate 612; depositing spacer layer 614; forming spacer 616; implanting gate and source/drain junctions with second photoresist on core 618; removing second photoresist 620; completing integrated circuit 622.

Various alternative sequences, additions, and deletions to this process chart would be obvious to those skilled in the art from a detailed reading of the present disclosure. Various implementations of the method may be used in different electronic devices and especially the dual bit memory cell architecture may be achieved according to one or more aspects of the present invention. In particular, the invention is applicable to memory devices wherein both bits in a dual bit cell are used for data or information storage.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters hither-to-fore set forth or shown in the accompanying drawings are to be interpreted in an illustrative and non-limiting sense.

The invention claimed is:

1. A method of manufacturing an integrated circuit comprising:
   providing a semiconductor substrate having a core region and a periphery region;
   implanting a threshold adjustment implant in the semiconductor substrate;
   depositing a charge-trapping dielectric material in the core region;
   depositing a gate dielectric material in the periphery region;
   depositing bitline photoresist layer over the gate dielectric material in the periphery region;
   forming bitlines in the semiconductor substrate in the core region and not in the periphery region, the bitlines spaced apart with the threshold adjustment implant in between thereof;
   removing the bitline photoresist layer;
   forming a wordline-gate material;
   implanting the wordline-gate material with wordline dopant in the core region and not in the periphery region;
   forming a wordline and a gate;
   implanting the semiconductor substrate around the gate with source/drain junctions; and
   implanting the gate with a gate dopant in the periphery region and not in the core region, the gate dopant the same type dopant as the wordline dopant.

2. The method of manufacturing an integrated circuit as claimed in claim 1, wherein:
   implanting the threshold adjustment implant includes implanting the threshold adjustment implant using a first type dopant; and
   implanting the wordline-gate material and implanting the gate using a second type dopant different from the first type dopant.

3. The method of manufacturing an integrated circuit as claimed in claim 1, wherein:
   providing the semiconductor substrate including providing a substrate having a first type dopant; and
   implanting the wordline-gate material and implanting the gate using a second type dopant different from the first type dopant.

4. The method of manufacturing an integrated circuit as claimed in claim 1, wherein:

providing the semiconductor substrate including providing a substrate having a first type dopant; and forming the bitlines using a second type dopant different from the first type dopant.

5. The method of manufacturing an integrated circuit as claimed in claim 1, wherein the charge-trapping material comprises:
   a first dielectric material,
   a charge-trapping material over the first dielectric material, and
   a second dielectric material over the charge-trapping material.

6. A method of manufacturing an integrated circuit comprising:
   providing a silicon substrate having a core region and a periphery region;
   implanting a threshold adjustment implant in the silicon substrate;
   depositing a charge-trapping dielectric layer on the silicon substrate in the core region;
   depositing a gate dielectric layer on the silicon substrate in the periphery region;
   depositing a bitline photoresist layer over the gate dielectric layer in the periphery region;
   implanting bitlines in the silicon substrate, the bitlines spaced apart with the threshold adjustment implant in between thereof;
   removing the bitline photoresist layer;
   depositing a wordline-gate layer over the charge-trapping dielectric layer and the gate dielectric layer;
   processing a periphery photoresist layer over the wordline-gate layer to cover the periphery region;
   implanting the wordline-gate layer with dopant in the core region to form a wordline implant;
   removing the periphery photoresist layer;
   forming a wordline having the wordline implant and a gate;
   forming spacers around the wordline and the gate;
   processing a core photoresist layer over the wordline and the gate to cover the core region;
   implanting the silicon substrate around the spacer around the gate with source/drain junctions;
   implanting the gate with a gate dopant, the gate dopant of the same type dopant as the wordline dopant; and
   removing the core photoresist layer.

7. The method of manufacturing an integrated circuit as claimed in claim 6, wherein:
   implanting the threshold adjustment implant includes implanting the threshold adjustment implant using a first type dopant; and
   implanting the wordline-gate layer and implanting the gate using a second type dopant different from the first type dopant.

8. The method of manufacturing an integrated circuit as claimed in claim 6, wherein:
   providing the silicon substrate including providing a substrate having a first type dopant; and
   implanting the wordline-gate layer and implanting the gate using a second type dopant different from the first type dopant.

9. The method of manufacturing an integrated circuit as claimed in claim 6, wherein:
   providing the silicon substrate including providing a substrate having a first type dopant; and forming the bitlines using a second type dopant different from the first type dopant.

10. The method of manufacturing an integrated circuit as claimed in claim 6 wherein the charge-trapping material comprises:
    a first dielectric material,
    a charge-trapping material over the first dielectric material, and
    a second dielectric material over the charge-trapping material.

11. A method of manufacturing an integrated circuit comprising:
    providing a p-type silicon substrate having a core region and a periphery region;
    implanting a threshold adjustment implant in the p-type silicon substrate;
    depositing a charge-trapping dielectric layer on the p-type silicon substrate in the core region;
    depositing a gate oxide on the p-type silicon substrate in the periphery region;
    depositing a bitline photoresist lager over the gate oxide in the periphery region;
    implanting n-type bitlines in the p-type silicon substrate, the n-type bitlines spaced apart with the threshold adjustment implant in between thereof;
    removing the bitline photoresist layer;
    depositing a polysilicon layer over the charge-trapping dielectric layer and the gate oxide;
    processing a periphery photoresist layer over the polysilicon layer to cover the periphery region;
    implanting the polysilicon layer in the core region to have a wordline implant of an n-type dopant;
    removing the periphery photoresist layer;
    forming a polysilicon wordline with the wordline implant and a polysilicon gate;
    forming a spacer around the polysilicon wordline and the polysilicon gate;
    processing a core photoresist layer over the polysilicon wordline and the polysilicon gate to cover the core region;
    implanting the p-type silicon substrate around the spacer with source/drain junctions;
    implanting the polysilicon gate with a gate implant of an n-type dopant; and
    removing the core photoresist layer.

12. The method of manufacturing an integrated circuit as claimed in claim 11, wherein:
    implanting the p-type silicon substrate around the spacer with the source/drain junctions includes implanting the source/drain junctions with an n-type dopant in the periphery region.

13. The method of manufacturing an integrated circuit as claimed in claim 11, wherein implanting the threshold adjustment implant includes implanting the threshold adjustment implant with a p-type dopant in the p-type silicon substrate.

14. The method of manufacturing an integrated circuit as claimed in claim 11, wherein depositing the charge-trapping dielectric layer comprises depositing:
    a first oxide,
    a nitride over the first oxide, and
    a second oxide over the nitride.

* * * * *